(12) United States Patent
Zhou et al.

(10) Patent No.: US 11,849,539 B2
(45) Date of Patent: Dec. 19, 2023

(54) EMBEDDED COOLING SYSTEMS UTILIZING HEAT PIPES

(71) Applicant: TOYOTA MOTOR ENGINEERING & MANUFACTURING NORTH AMERICA, INC., Plano, TX (US)

(72) Inventors: Feng Zhou, Ann Arbor, MI (US); Ercan Mehmet Dede, Ann Arbor, MI (US)

(73) Assignee: TOYOTA MOTOR ENGINEERING & MANUFACTURING NORTH AMERICA, INC., Plano, TX (US)

(*) Notice: Subject to any disclaimer, the term of this patent is extended or adjusted under 35 U.S.C. 154(b) by 44 days.

(21) Appl. No.: 16/992,561

(22) Filed: Aug. 13, 2020

(65) Prior Publication Data
US 2022/0053634 A1 Feb. 17, 2022

(51) Int. Cl.
*H05K 1/02* (2006.01)
*H01L 23/427* (2006.01)
(Continued)

(52) U.S. Cl.
CPC ........ *H05K 1/0272* (2013.01); *H01L 23/427* (2013.01); *H05K 7/20336* (2013.01);
(Continued)

(58) Field of Classification Search
CPC ............. H05K 1/0272; H05K 7/20336; H05K 7/20936; F28D 15/0233; H01L 23/427; H01H 9/52; H01H 2009/523
See application file for complete search history.

(56) References Cited

U.S. PATENT DOCUMENTS 7,345,877 B2 * 3/2008 Asfia .................. F28D 15/0266
361/700
9,107,290 B1 * 8/2015 Chen ................. H01L 23/49811
(Continued)

FOREIGN PATENT DOCUMENTS

CN 110494018 A * 11/2019
EP 2858464 A1 4/2015
(Continued)

OTHER PUBLICATIONS

Yang, Ming-dong, "An Optical Module", Nov. 22, 2019, Entire Document (translation of CN 110494018) (Year: 2019).*
(Continued)

*Primary Examiner* — Zachary Pape
(74) *Attorney, Agent, or Firm* — Dinsmore & Shohl LLP (57) ABSTRACT

Embedded cooling systems and methods of forming the same are disclosed. An embedded cooling system includes a PCB having a first major surface opposite a second major surface and power device stacks embedded within the PCB between the first major surface and the second major surface. Each power device stack includes a first substrate and a second substrate, and an electrical insulation layer disposed between the first substrate and the second substrate. The embedded cooling system further includes a power device coupled to the first substrate of each power device stack and heat pipes having a first end and a second end spaced a distance apart from the first end. The first end is embedded within the PCB substrate and the second end extends outside of the PCB substrate. The second substrate of the one or more power device stacks is coupled to the one or more heat pipes.

20 Claims, 7 Drawing Sheets

(51) Int. Cl.
*H05K 7/20* (2006.01)
*F28D 15/02* (2006.01)
*H01H 9/52* (2006.01)

(52) U.S. Cl.
CPC ... *F28D 15/0233* (2013.01); *H01H 2009/523* (2013.01); *H05K 7/20936* (2013.01)

(56) References Cited

U.S. PATENT DOCUMENTS

| | | | |
|---|---|---|---|
| 9,750,160 | B2 | 8/2017 | Short, Jr. et al. |
| 10,269,678 | B1* | 4/2019 | Viswanathan ........ H01L 23/047 |
| 2004/0188132 | A1* | 9/2004 | Borrego Bel ........ H05K 1/0272 |
| | | | 174/252 |
| 2007/0045801 | A1* | 3/2007 | Sugiyama ........... H05K 1/0271 |
| | | | 257/684 |
| 2011/0067843 | A1 | 3/2011 | Vasiliev, Jr. |
| 2013/0083485 | A1* | 4/2013 | Tong ..................... H01L 23/427 |
| | | | 361/700 |
| 2013/0155616 | A1* | 6/2013 | Tong ................. H05K 7/20909 |
| | | | 361/696 |
| 2014/0226284 | A1* | 8/2014 | Yamauchi ............... C23C 24/04 |
| | | | 361/722 |
| 2016/0352244 | A1* | 12/2016 | Cheng ................. H05K 1/0209 |
| 2016/0352246 | A1* | 12/2016 | Lai ........................... H01L 24/24 |
| 2018/0096912 | A1* | 4/2018 | de Sousa ............. H05K 1/0272 |
| 2018/0228055 | A1* | 8/2018 | Yoshizumi ......... H05K 7/20272 |
| 2019/0159368 | A1* | 5/2019 | Maroo ............... H05K 7/20336 |
| 2020/0161212 | A1* | 5/2020 | Mrad .................... H01L 23/473 |
| 2020/0176355 | A1* | 6/2020 | May .................. G11B 33/1406 |
| 2020/0236812 | A1* | 7/2020 | Smith ............... G11B 33/1406 |
| 2020/0245500 | A1* | 7/2020 | Joshi ................. H05K 7/20309 |
| 2021/0259134 | A1* | 8/2021 | Uppal .................. H05K 7/2039 |

FOREIGN PATENT DOCUMENTS

| | | |
|---|---|---|
| EP | 3011249 B1 | 9/2018 |
| IN | 201621019958 A | 10/2016 |

OTHER PUBLICATIONS

Kearney, Daniel J. et al. "Thermal performance of a PCB embedded pulsating heat pipe for power electronics applications." Applied Thermal Engineering, 98 (2016) 798-809. Elsevier Ltd., Dec. 23, 2015. https://www.researchgate.net/publication/288024394_Thermal_performance_of_a PCB_embedded_pulsating_heat_pipe_for_power_electronics_applications.

* cited by examiner

EMBEDDED COOLING SYSTEMS UTILIZING HEAT PIPES

TECHNICAL FIELD

The present disclosure generally relates to heat transfer components and, more specifically, to cooling systems embedded within substrates having embedded power devices, the substrates utilizing a particular arrangement and configuration of heat pipes for the purposes of cooling the embedded power devices.

BACKGROUND

Power control units (PCUs) include power cards having power devices, cooling device(s), gate drivers, printed circuit board (PCB), capacitors, and other components. A component of the PCU is a power card, which contains power devices that may be switched on and off in high frequency during operation of a vehicle, for example. These power devices may generate significant amounts of heat. Conventional power cards have designs for exposing surface area of the power devices for cooling purposes. Some PCU configurations include power cards that are sandwiched within liquid cooled units to maintain a proper temperature while they are switching on and off, because switching generates heat. Furthermore, the power cards are connected to the driver board through pin connections. Such power cards may be mounted to a driver board via pins and may extend a distance from the driver board, leading to a larger volume profile which includes a small power density and a high system loop inductance, resulting in a high power loss, especially at high switching frequencies. Improvements within the PCU structure are desirable to improve the power density and cooling of the PCU.

SUMMARY

In one aspect, an embedded cooling system includes a printed circuit board (PCB) substrate having a first major surface opposite a second major surface and one or more power device stacks embedded within the PCB substrate between the first major surface and the second major surface. Each one of the one or more power device stacks includes a first substrate and a second substrate, and an electrical insulation layer disposed between the first substrate and the second substrate. The embedded cooling system further includes a power device coupled to the first substrate of each of the one or more power device stacks and one or more heat pipes having a first end and a second end spaced a distance apart from the first end. The first end is embedded within the PCB substrate and the second end extends outside of the PCB substrate. The second substrate of the one or more power device stacks is coupled to the one or more heat pipes.

In another aspect, an embedded cooling system includes a printed circuit board (PCB) substrate having a first major surface opposite a second major surface and a plurality of power device stacks embedded within the PCB substrate between the first major surface and the second major surface. Each one of the plurality of power device stacks includes a first substrate having a cavity formed therein, a second substrate having one or more recesses formed therein, and an electrical insulation layer disposed between the first substrate and the second substrate such that the cavity and the one or more recesses face away from each other. The embedded cooling system further includes a plurality of power devices, each one of the plurality of power devices received within the cavity of the first substrate of each of the plurality of power device stacks and thermally coupled to the first substrate. The embedded cooling system further includes one or more heat pipes having a first end and a second end spaced a distance apart from the first end. The first end is embedded within the PCB substrate and the second end extends outside of the PCB substrate. The one or more heat pipes are received within the one or more recesses of the second substrate. The embedded cooling system further includes at least one cooling assembly arranged externally to the PCB substrate such that the second end of the one or more heat pipes is at least partially disposed within the at least one cooling assembly.

In yet another aspect, a method of forming an embedded cooling system includes forming a first substrate with a cavity therein, forming a second substrate having a plurality of recesses therein, bonding the first substrate and the second substrate to an electrical insulation disposed between the first substrate and the second substrate such that the cavity of the first substrate faces in a direction opposite of a direction in which the plurality of recesses face, forming a power device stack, bonding a power device within the cavity of the first substrate, bonding one or more pulsating heat pipes within the plurality of recesses of the second substrate, and embedding the power device stack, the power device, and the one or more pulsating heat pipes within a substrate such that a portion of the one or more pulsating heat pipes extends to a location that is external to the substrate.

These and additional objects and advantages provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

The devices described herein generally relate to embedded cooling systems that include power devices (e.g., embedded power semiconductor devices) and heat pipes, such as pulsating heat pipes (PHPs) embedded within substrates such as gate driver printed circuit boards (PCBs). The embedded power devices shown and described herein utilize copper layers, pre-impregnated ("prepreg") layers, and/or copper vias to form an inverter topology, a convertor topology, or a similar topology. Various configurations are shown and described herein. One or more of the copper layers are formed to receive the embedded heat pipes, which are configured to extend from the copper layer(s) to a location outside of the substrate, the location having a cooling assembly (e.g., a condenser) to facilitate heat transfer.

Each structure shown and described herein provides advantages over traditional topologies (e.g., surface mounted power device topologies) because of the location and configuration of particular components. For example, the power device embedded substrates described herein provide smaller system volumes, lighter system weights, higher system power densities (e.g., power modules that include power device embedded PCBs are configured to operate at 40 kilowatts (kW) or more), lower overall inductances that deliver smaller switching losses, particularly at high switching frequency, overall lower cost, and/or more easily fits into new and unique locations within a vehicle (e.g., within wheels or the like).

Furthermore, embodiments described herein propose various embedded power semiconductor devices within a substrate. The topologies further provide improved cooling of the system by reducing and/or eliminating thermal resistance layers between the power semiconductor devices and coolers such as vapor chambers and/or cold plates. By doing so, the device can maintain lower running temperatures with the same cooler performance or run at a higher power output as heat may be removed more efficiently. Embodiments shown and described herein reduce and/or eliminate the external electrical isolation layer (and grease layer) and provide a more direct and improved thermal conductive path for removing heat from a power semiconductor device.

Some configurations include a PCB having power devices embedded therein. The power devices may be bonded to copper substrates. The copper substrates, because of the need to electrically couple one or more conductive power layers from one or more surfaces of the power device, the power devices must be electrically isolated outside of the PCB, which reduces the thermal conductivity of the power control unit.

In general, traditional power device embedded PCB configurations utilize the electrical conductive properties of the copper substrates to connect to the power devices through a second surface, for example, the bottom of the copper substrates via vias. However, since the copper substrates are coupled via one or more vias, the thermal conductance from the power devices and the copper substrates is reduced since a cold plate and/or vapor chamber may not be bonded to the copper substrates but rather to the power devices through vias and one or more copper layers used to electrically couple and control the power devices. That is, due to power layers connecting to the power devices from a first surface and a second surface of the power device, vias are needed and thus restrict thermal conduction from the copper substrates and the corresponding power devices.

Accordingly, traditional power device embedded PCB configurations connect an electrical insulation layer via one or more grease layers to a cold plate and optionally another electronic device such as a power capacitor that needs to be cooled. Other traditional embodiments connect an electrical insulation layer via one or more grease layers to a vapor chamber and/or a cold plate and optionally another electronic device such as a power capacitor that needs to be cooled.

In contrast, embodiments according to the present disclosure provide electronic assembly configurations that improve thermal conductivity of the power devices embedded in the substrates. In particular, some embodiments implement a direct bonded insulation device such as a direct bonded copper substrate, a direct bonded aluminum device, or an active metal bonding substrate to the power semiconductor device at a first surface and directly to a heat pipe at a second surface opposite the first surface, the heat pipe being at least partially embedded within the substrate and thermally coupled to a condenser that is located outside the substrate.

As shown and described herein, new implementations of heat pipes at least partially embedded within a substrate are provided. Turning now to the figures, FIGS. 1, 2, 3A-3C, 4A-4C, and 5A-5B depict various configurations that provide thermal coupling of heat pipes to the power devices thereby improving thermal conductance within the electronics assembly as compared to traditional configurations.

Figure 1:
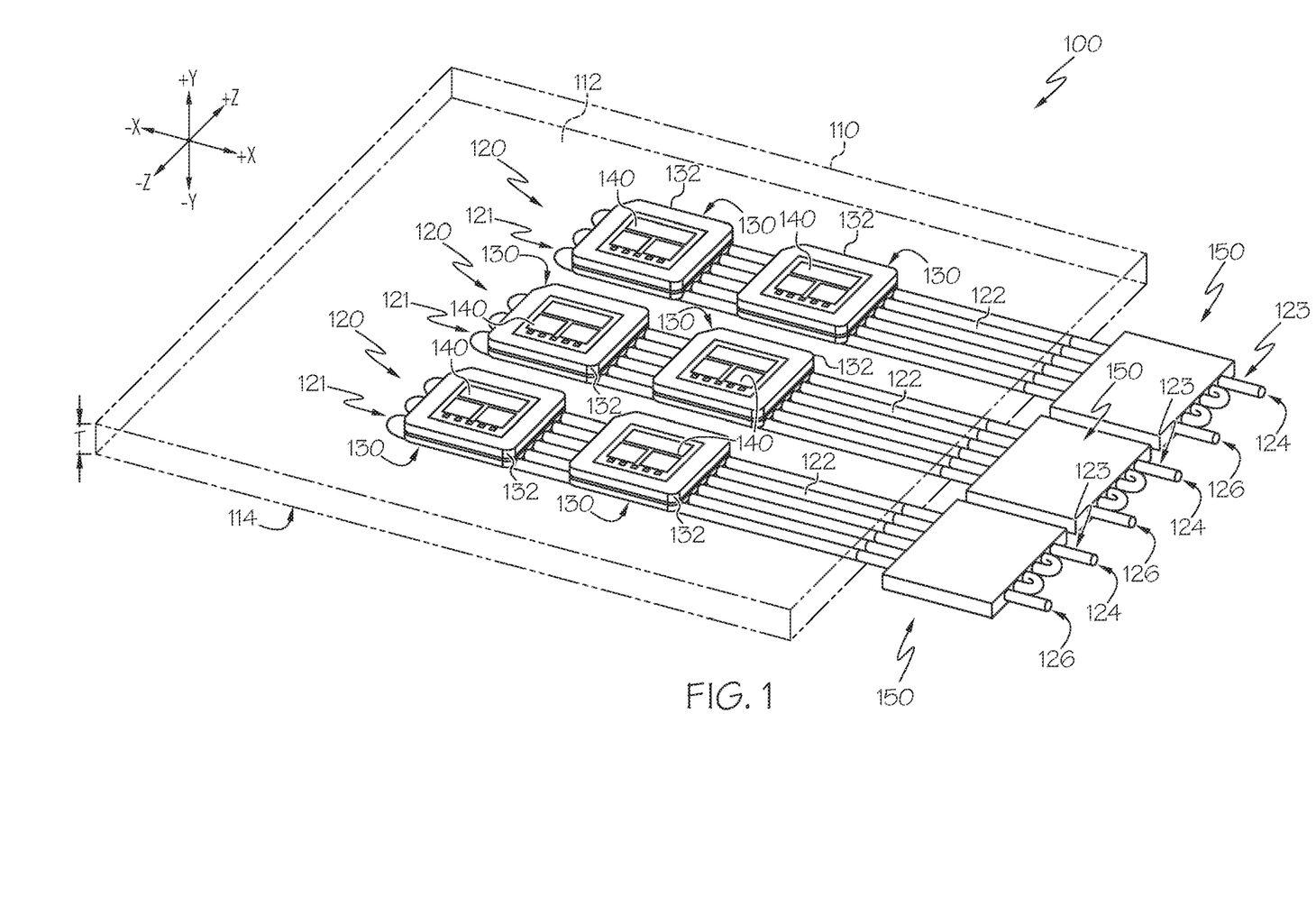
FIG. 1 schematically depicts a perspective view of an illustrative embedded cooling system including a substrate with a plurality of embedded power devices and a plurality of embedded heat pipes according to one or more embodiments shown and described herein.

Referring now to FIG. 1, an illustrative embedded cooling system 100 is depicted. The embedded cooling system 100 includes a substrate 110 (also referred to herein as a PCB substrate), one or more power device stacks 130 embedded within the substrate 110, and one or more heat pipes 122 that are at least partially embedded within the substrate 110 and thermally coupled to one or more power devices 140 coupled to the power device stacks 130. In some embodiments, the embedded cooling system 100 may further include one or more cooling assemblies 150 thermally coupled to the plurality of heat pipes 122. In some embodiments, a power module may include at least the substrate 110 and the one or more power devices 140, and may further include one or more components (including components not specifically disclosed herein).

While FIG. 1 depicts a single substrate 110, a plurality of power device stacks 130 (e.g., six power device stacks 130), a plurality of heat pipes 122 (e.g., three heat pipes 122), the plurality of power devices 140 (e.g., six power devices 140), and a plurality of cooling assemblies 150 (e.g., three cooling assemblies 150), the present disclosure is not limited to such. That is, the embedded cooling system 100 may include any number of substrates 110, any number of power device stacks 130, any number of heat pipes 122, any number of power devices 140, and/or any number of cooling assemblies 150. Further, while FIG. 1 depicts an unequal number of power device stacks 130, heat pipes 122, power devices, 140, and cooling assemblies 150 (e.g., arranged such that a single cooling assembly 150 is thermally coupled via a single heat pipe 122 to a plurality of device stacks 130 and a plurality of power devices 140), the present disclosure is not limited to such. That is, various ones of the power device stacks 130, heat pipes 122, power devices, 140, and cooling assemblies 150 may be coupled to a plurality of other various ones of the power device stacks 130, heat pipes 122, power devices 140, and cooling assemblies 150. For example, a single heat pipe 122 may be coupled to a single power device stack 130 and a single cooling assembly 150 in some embodiments.

Figure 2:
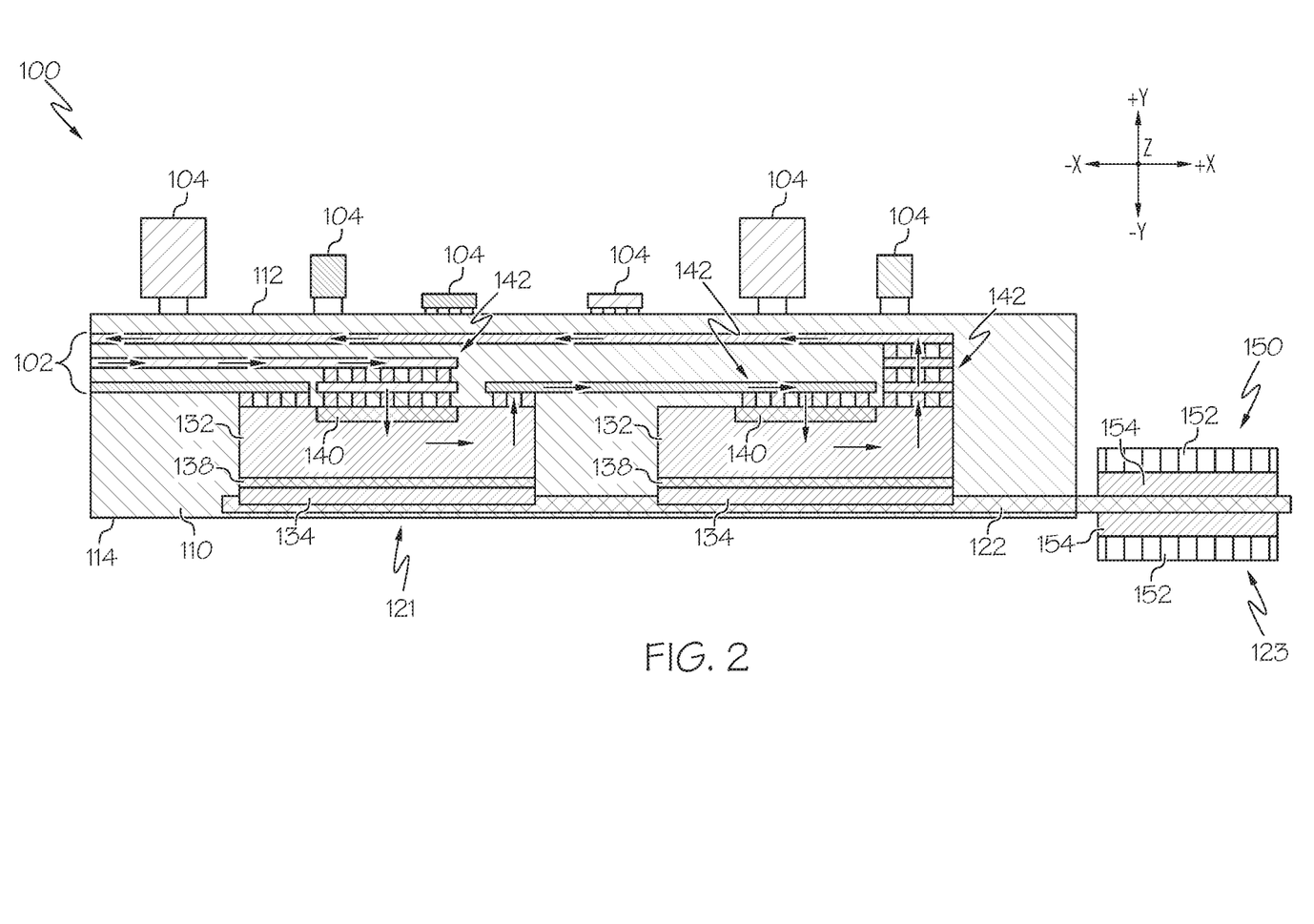
FIG. 2 depicts a cutaway side view of an illustrative embedded cooling system according to one or more embodiments shown and described herein.

The substrate 110 is depicted having a first major surface 112 (e.g., a top surface, facing the +Y direction of the coordinate axes of FIG. 1) and a second major surface 114 (e.g., a bottom surface, facing the −Y direction of the coordinate axes of FIG. 1) opposite the first major surface and separated by a thickness T of substrate material. The substrate 110 includes both embedded layers and a surface layer having one or more passive components or active components 104 (FIG. 2). Referring also to FIG. 2, the one or more passive components or active components 104 may include resistors, capacitors, inductors, diodes, oscillators, transistors, integrated circuits, switches, terminals or the like. The substrate 110 also includes one or more power conductive layers 102 configured to provide electrical power to and from the power devices 140 embedded within the substrate 110 by way of vias 142. The substrate 110 (and other example substrates, PCBs, or the like disclosed herein) may include one or more additional copper layers above one or more power conductive layers for signal connections between the components on the top surface (e.g., the first major surface 112) and the one or more power devices 140. These layers may be referred to generally as a logic layer.

Illustrative substrate materials may include any known or yet to be discovered materials, for example, without limitation, FR-2 (phenolic cotton paper), FR-3 (cotton paper and epoxy), FR-4 (woven glass and epoxy), FR-5 (woven glass and epoxy), FR-6 (matte glass and polyester), G-10 (woven glass and epoxy), CEM-1 (cotton paper and epoxy), CEM-2 (cotton paper and epoxy), CEM-3 (non-woven glass and epoxy), CEM-4 (woven glass and epoxy), CEM-5 (woven glass and polyester), PTFE (Polytetrafluoroethylene), RF-35 (fiberglass-reinforced ceramics-filled PTFE), alumina, polyimide. In some embodiments, the substrate material may be a laminate, cloth or fiber material, resin, silicon, polymer, or the like. In some embodiments, the substrate material may be chosen based on the temperature range (e.g., the operating temperature) of the embedded power semiconductor device.

Still referring to FIGS. 1 and 2, the power devices 140 and any others depicted and described herein may include, for example, one or more semiconductor devices such as, but not limited to, an insulated gate bipolar transistor (IGBT), a reverse conducting IGBT (RC-IGBT), a metal-oxide-semiconductor field-effect transistor (MOSFET), a power MOSFET, a diode, a transistor, and/or combinations thereof. In some embodiments, at least one of the plurality of power devices 140 may include a wide-bandgap semiconductor, and may be formed from any suitable material such as, but not limited to, silicon carbide (SiC), silicon dioxide (SiO$_2$), aluminum nitride (AlN), gallium nitride (GaN), and boron nitride (BN), and the like. In some embodiments, the plurality of power devices 140 may operate within a power module having a high current and/or a high power (for example, greater than or equal to 5 kW, 10 kW, 20 kW, 30 kW, 40 kW, 50 kW, 60 kW, 70 kW, 80 kW, 90 kW, 100 kW, 110 kW, 120 kW, 130 kW, 140 kW, or 150 kW or any value therebetween) and under high temperatures (for example, in excess of 100° C., 150° C., 175° C., 200° C., 225° C., or 250° C.) and generate a large amount of heat that must be removed for the continued operation of the power module (including the power devices 140).

Traditional embodiments of power modules including the embedded power devices 140 cannot handle the heat generated by high power semiconductor devices because the thermal conductance paths from the power semiconductor device to cooling devices have undesirable thermal resistances. These thermal resistances are the result of small isolated paths such as vias used for electrical power delivery, which are configured between one or more conductive layers that prohibit the ability for more direct bonding of a cold plate 152 to a direct bonding layer and thus a low thermal resistance path. However, present embodiments utilize the heat pipes 122 directly bonded to the power device stacks 130 coupled to the power devices 140. Such a configuration allows for more efficient and effective heat transfer from the power modules including the power devices 140, as described herein.

Still referring to FIGS. 1-2, in some embodiments, the plurality of power devices 140 may be controlled by a gate drive device (not shown) in the substrate 110 to change a current type between an alternating current to a direct current, for example.

Referring to FIGS. 1, 2 and 3A-3C, in embodiments described herein, the power devices 140 may be bonded to the power device stack 130 to form an embedded power device 120. The power device stack 130 includes, for example, a first substrate 132 and a second substrate 134 (e.g., electrically and thermally conductive substrates) and an electrical insulation layer 138. The first substrate 132 includes a first surface 131 (FIGS. 3B-3C) and a second surface 133 (FIG. 3C) opposite the first surface 131 (e.g., an upper surface and a lower surface opposite the upper surface). The second substrate 134 includes a first surface 135 (FIGS. 3B-3C) and a second surface 137 (FIG. 3C) opposite the first surface 135 (e.g., an upper surface and a lower surface opposite the upper surface). The first substrate 132 and the second substrate 134 may each include copper, aluminum, gold, silver, or other metals or alloys.

Figure 3A:
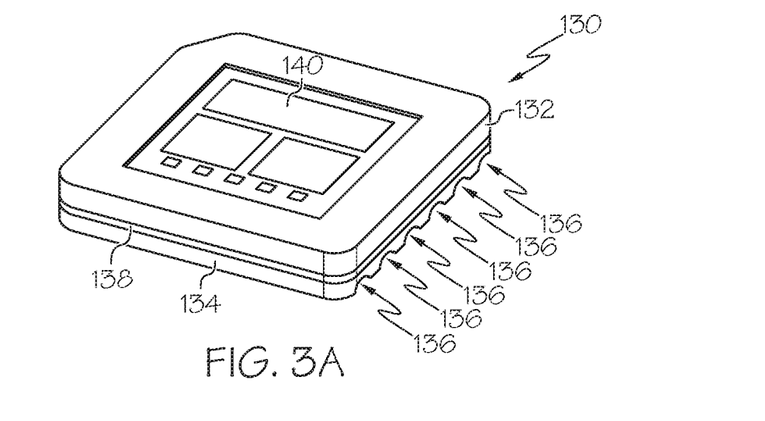
FIG. 3A depicts a perspective view of an illustrative power device stack according to one or more embodiments shown and described herein.
Figure 3B:
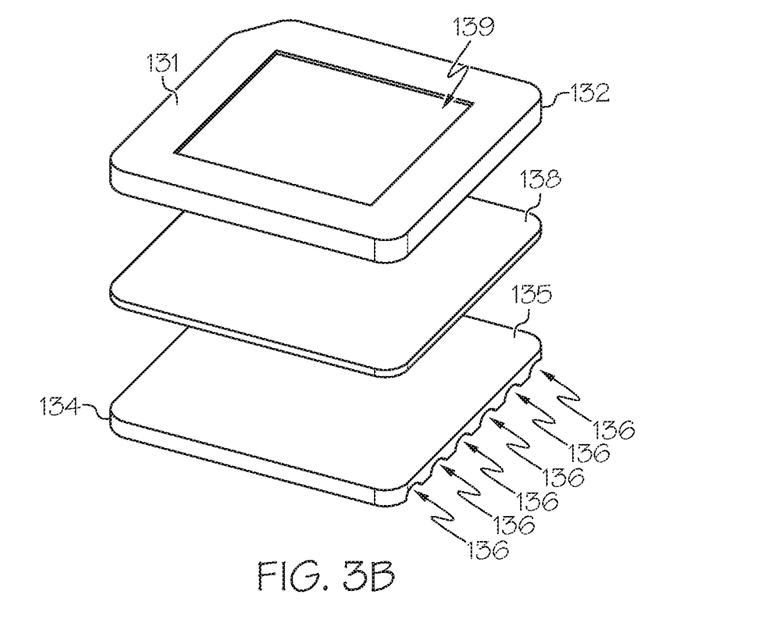
FIG. 3B depicts an exploded perspective view of the illustrative power device stack of FIG. 3A according to one or more embodiments shown and described herein.
Figure 3C:
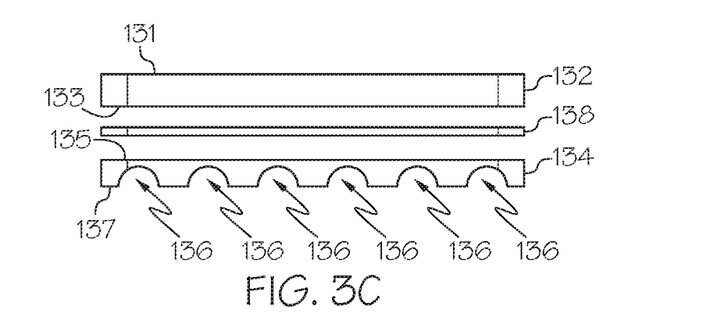
FIG. 3C depicts an exploded side view of the illustrative power device stack of FIG. 3A according to one or more embodiments shown and described herein.

Referring to FIGS. 3A-3C, the power devices 140 (FIG. 3A) may be bonded to the first substrate 132 on the first surface 131 (FIGS. 3B-3C) thereof. The second surface 133 (FIG. 3C) of the first substrate 132 may be coupled to the electrical insulation layer 138. In addition, the electrical insulation layer 138 may be coupled to the first surface 135 (FIGS. 3B-3C) of the second substrate 134 such that the electrical insulation layer 138 is disposed between the first substrate 132 and the second substrate 134. In some embodiments, the first substrate 132 may include a cavity 139 in the first surface 131 that is sized and shaped to receive one or more of the power devices 140 to provide a close mating between the power devices 140 and the first substrate 132. However, this is not a requirement as the power devices 140 may be bonded to the first substrate 132.

As noted above, the electrical insulation layer 138 bonded to the first substrate 132 and the second substrate 134 between the first substrate 132 and the second substrate 134.

For example, the electrical insulation layer 138 may be bonded to the second surface 133 of the first substrate 132. Similarly, for example, the electrical insulation layer 138 may also be bonded to the first surface 135 of the second substrate 134. As described in greater detail herein, the electrical insulation layer 138 may be bonded to the first substrate 132 and/or the second substrate via silver sintering, TLP bonding, or the like. The electrical insulation layer 138 may be a ceramic or similar material capable of good thermal conductivity and electrical isolation. For example, the electrical insulation layer 138 may be a ceramic dielectric layer such as Alumina (Al2O3), Aluminum nitride (AlN), Beryllium oxide (BeO), or the like. In some embodiments, the electrical insulation layer 138 may be an insulated metal substrate (IMS) dielectric layer.

As used herein, the first substrate 132, the second substrate 134, and the electrical insulation layer 138 define a direct bonded insulation device. The direct bonded insulation device may be, for example, a direct bonded copper (DBC) substrate, a direct bonded aluminum (DBA) substrate, or an active metal brazing (AMB) substrate.

Still referring to FIGS. 3A-3C, the second surface 137 (FIG. 3C) of the second substrate 134 may be shaped and/or formed with a plurality of recesses 136 (e.g., grooves or the like) in the second substrate 134. The recesses 136 are generally voids in the second substrate 134 that are shaped, sized, and/or configured to correspond to a shape, size, and/or configuration of the heat pipes 122 (FIG. 1) such that the heat pipes 122 can fit within the recesses 136 (e.g., at, near, or toward the first end 121 of the heat pipes 122). That is the recesses 136 are shaped and sized to receive the heat pipes 122 therein to provide a close mating of the second substrate 134 with the heat pipes 122. For example, as depicted in FIG. 3C, the second surface 137 is formed such that the recesses 136 are a plurality of semicircular grooves in the second surface 137 that correspond to the shape and size of the heat pipes 122 (which are round and have a diameter that is about the same as the diameter of the semicircular grooves) so that the heat pipes 122 (particularly an area at, near, or toward the first end 121 thereof) can be received within the semicircular grooves. In addition, as described in greater detail herein, the heat pipes 122 are formed into a plurality of turns, the plurality of turns corresponding to the number of recesses 136 in the second surface 137. For example, in the embodiment depicted in FIGS. 3A-3C, six (6) recesses 136 are formed in the second surface 137 of the second substrate 134, which corresponds to the heat pipe 122 depicted in FIG. 1 having six (6) turns.

The cooling assemblies 150 may include any device or combination of devices that remove heat generated by the power devices 140. Referring to FIG. 2, in some embodiments, the cooling assemblies 150 may each include a heat spreader layer 154 and a cold plate 152. The heat spreader layer 154 may be formed of a plurality of separate parts or may be formed as a single piece component. It is noted that the cooling assemblies 150 may include a greater or fewer number of components without departing from the scope of the present disclosure.

In some embodiments, while not depicted herein, the cooling assemblies 150 may be assembled such that one or more grease layers (e.g., thermal grease layers) interface between one or more of the layers of the cooling assemblies 150 to reduce thermal resistance and/or increase thermal conductivity by eliminating thermally insulating air pockets which may otherwise form between the various layers of the cooling assemblies 150. For example, in some embodiments, the cooling assemblies 150 may include a grease layer between the heat spreader layer 154 and the cold plate 152. The one or more grease layers may include, for example, epoxies, silicones, urethanes, acrylates, metals, metal-alloys, or any combination thereof.

While FIGS. 1 and 2 depict the cooling assemblies 150 as being located separate from the substrate 110 (e.g., free standing and not attached to the substrate 110), the present disclosure is not limited to such. In some embodiments, the cooling assemblies 150 may contact the substrate 110, may be about the substrate 110, may be located adjacent to the substrate 110 to receive one or more layers therebetween, or the like. For example, the cooling assemblies 150 may be fixed to the substrate 110 via a plurality of fasteners (e.g., bolts). However, other coupling techniques are contemplated and possible. For example, an external housing or cage (not shown) may mount the cooling assemblies 150 to the substrate 110.

In another example, an electrical insulation layer may be disposed between one or more layers of the cooling assemblies 150 (e.g., between the heat spreader layer 154 and/or the cold plate 152) to electrically isolate electricity from one or more components of the cooling assemblies 150 (e.g., the heat spreader layer 154 and/or the cold plate 152). The electrical insulation layer may include any electrically insulating, thermally conductive material (e.g., beryllium oxide, aluminum nitride, or the like) or combination of materials. The electrical insulation layer may be in contact with one or more layers of the cooling assemblies 150 through a TIM (Thermal Interface Material) layer to ensure contact in some embodiments. In some embodiments, the one or more TIM layers may be electrically insulating to electrically isolate one or more layers of the cooling assemblies 150 and may in some embodiments form an electrical insulation layer therebetween.

As depicted in FIG. 2, the heat spreader layer 154 may be disposed between the heat pipes 122 and the cold plate 152. The heat spreader layer 154 is a block of thermally conductive material (e.g., copper block, aluminum block, or the like) that surrounds the heat pipe 122 such that an end of the heat pipe 122 outside of the substrate 110 (e.g., a second end 123 as described in further detail hereinbelow) is embedded in the block of material defining the heat spreader layer 154. In some embodiments, the cold plate 152 is attached to the heat spreader layer 154 via a grease layer, as previously described herein. In other embodiments, the heat spreader layer 154 may be formed as part of the cold plate 152 (e.g., via formation of a fin structure on the block of material and bonding of the block of material with the fin structure into a cold plate 152 manifold such that the heat spreader layer 154 functions as a heat sink of the cold plate 152). In some embodiments, the cooling assemblies 150 may not include a heat spreader layer 154, such as in lower power assemblies (e.g., less than about 40 KW, such as about 5 KW to about 10 KW).

The cold plate 152 may be mounted to the heat spreader layer 154 (or directly to the heat pipes 122 if the heat spreader layer 154 is not present) to thermally couple the cold plate 152 to the heat pipes 122. In some embodiments, the cold plate 152 may be coupled to the heat spreader layer 154 (or to the heat pipes 122 if the heat spreader layer 154 is not present) via a grease layer to improve contact between the cold plate 152 and the heat spreader layer 154 (or the heat pipes 122 if the heat spreader layer 154 is not present). In embodiments where the heat spreader layer 154 is not present, the heat pipes 122 may be brazed in the base of the cold plate 152 or otherwise attached via any other bonding method now known or later developed. In some embodiments, grooves may be formed on the base of the cold plate 152, the grooves shaped and sized to correspond to grooves of a corresponding metal piece that is bolted to the base of the cold plate 152 such that the heat pipe 122 is sandwiched between the corresponding metal piece and the cold plate 152 within the grooves. In such an embodiment, a grease layer is disposed between the heat pipe 122 and the grooves. The cold plate 152 may draw heat through the cooling assembly 150 from the power device 140 via the heat pipes 122. The cold plate 152 may include one or more channels formed therein which allow for coolant fluid to be circulated through the cold plate 152 to draw heat away from the cold plate 152. In some embodiments, a cold plate 152 may include a plurality of fins past which coolant fluid may flow to draw heat from the cold plate 152.

Referring again to FIG. 1, the heat pipes 122 each include a first end 121 and a second end 123, where the second end is spaced a distance apart from the first end 121. The heat pipes 122 are arranged to be at least partially embedded within the substrate 110 such that the each one of the heat pipes 122 extends between a respective one or more of the power device stacks 130 that are also embedded in the substrate 110 and a respective one of the cooling assemblies 150 not located within the substrate 110. As such, the heat pipes 122 are at least partially embedded because a portion of each one of the heat pipes 122 extends out of the substrate 110 to a respective one of the cooling assemblies 150 (e.g., the second end 123 of the heat pipes 122). For example, the first end 121 of the heat pipes 122 (e.g., an evaporator end) may be embedded within the substrate 110. In addition, the heat pipes 122 may extend out of the substrate 110 such that the second end 123 of the heat pipes 122 (e.g., a condenser end) is not within the substrate 110. Further, at least part of the second end 123 of the heat pipes 122 is located within the cooling assembly 150.

The heat pipes 122 described herein are generally pulsating heat pipes (PHP) or miniature heat pipes having a wick structure therein. Pulsating heat pipes (PHP), which may also be known as oscillating heat pipes (OHP), are two-phase heat transfer devices that rely on an oscillatory flow of liquid slug and vapor plug in a long miniature tube that is bent into a plurality of turns. Illustrative heat pipes include, but are not limited to, a closed loop system, a closed loop system with additional control check valves, and an open loop system. A miniature heat pipe with a wick structure is generally a miniaturized version of a conventional heat pipe that includes an inner wall and an outer wall, the inner wall and outer wall forming an envelope therebetween containing a wick structure and working fluid, the working fluid condensing to liquid phase on a condenser side to flow through the wick structure via capillary action to an evaporator side, where it evaporates and travels through a center of the heat pipe to the condenser side, thereby condensing and starting the process over again.

A PHP generally includes a meandering (e.g., serpentine) tube of capillary dimensions having a plurality of straight or substantially straight sections fluidly coupled between a plurality of turns (e.g., U-turns). In contrast to a conventional heat pipe, PHPs do not have an additional capillary structure inside the tube. A PHP is a complex heat transfer device with a strong thermo-hydraulic coupling governing its performance. A PHP is essentially a non-equilibrium heat transfer device. The performance success of a PHP primarily depends on the continuous maintenance or sustenance of these non-equilibrium conditions within the PHP. A PHP is filled with a working fluid, which naturally distributes itself in the form of liquid-vapor plugs and slugs inside the capillary tube. The liquid and vapor slug transport results because of the pressure pulsations caused within the PHP. Since the pressure pulsations are fully thermally driven and because of the inherent constructions of the PHP, no external mechanical power source is necessary for fluid transport within the PHP.

Figure 4A:
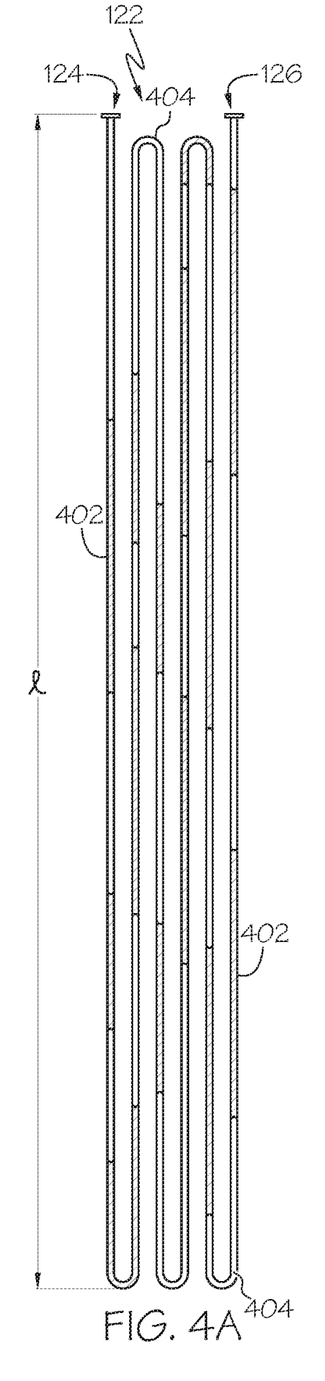
FIG. 4A depicts an illustrative open pulsating heat pipe of an embedded cooling system according to one or more embodiments shown and described herein.
Figure 4B:
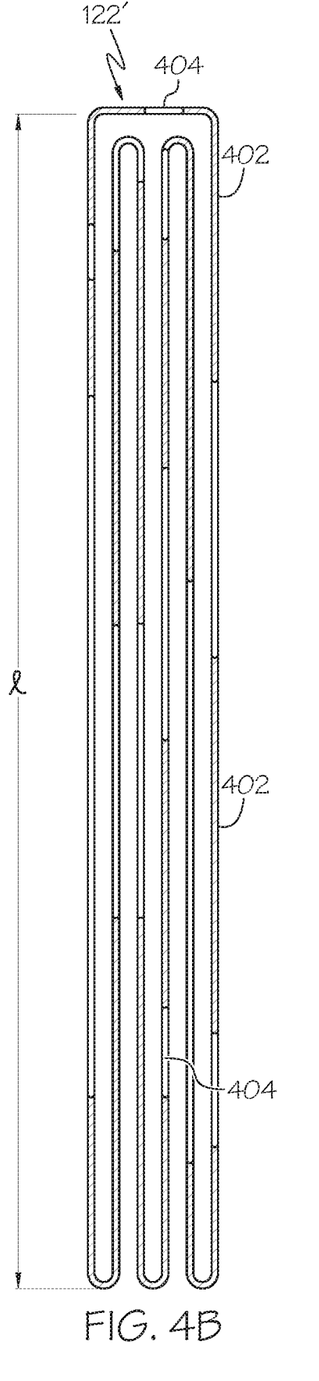
FIG. 4B depicts an illustrative closed loop pulsating heat pipe of an embedded cooling system according to one or more embodiments shown and described herein.
Figure 4C:
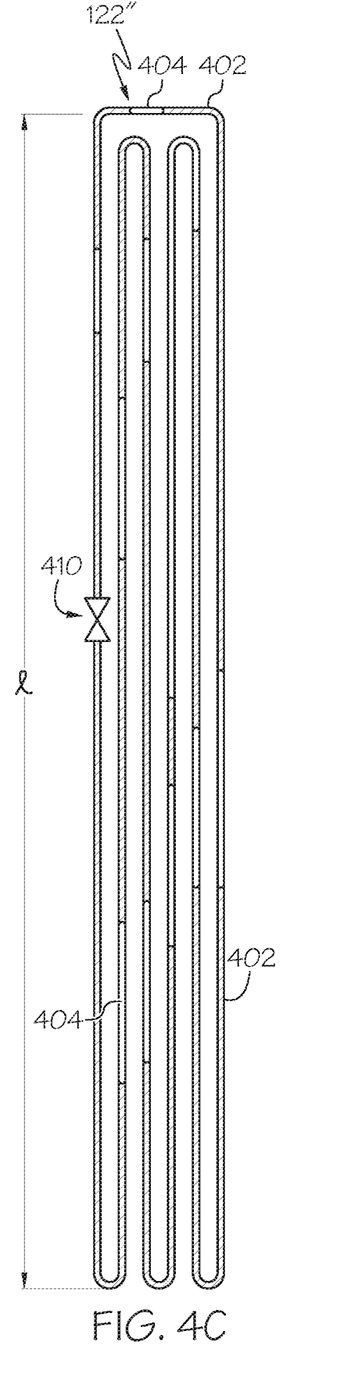
FIG. 4C depicts an illustrative closed loop pulsating heat pipe with a check valve of an embedded cooling system according to one or more embodiments shown and described herein.

As described in greater detail herein, the PHPs can be arranged as an open loop PHP or a closed loop PHP. FIGS. 4A-4C depict illustrative examples of PHPs that may be implemented in various embodiments of the present disclosure. For example, the heat pipe 122 depicted in FIG. 4A is an open PHP, which is also the type of PHP depicted in the embodiment of FIG. 1. The heat pipe 122' depicted in FIG. 4B is a closed PHP. The heat pipe 122" depicted in FIG. 4C is a closed PHP with a check valve. Each of the various types of PHP depicted in FIGS. 4A-4C will now be described in more detail.

Referring to FIGS. 1 and 4A, the heat pipe 122 is an open pulsating heat pipe (OPHP) (also referred to as an open oscillating heat pipe) having a length l (e.g., a distance between the first end 121 to the second end 123 as depicted in FIG. 1). The OPHP is "open" in the sense that it has two ends that are not connected to each other instead of being a closed loop as described hereinbelow. That is, the heat pipe 122 includes a first terminus 124 and a second terminus 126. The first terminus 124 and/or the second terminus 126 of the heat pipe 122 may be closed, sealed, or may have an opening that is selectively closed. In some embodiments, the first terminus 124 may include a filling port and the second terminus 126 may include a closed port. As described in greater detail herein, the filling port and the closed port may provide a location for evacuating the heat pipes 122 and/or filling the heat pipes 122 with a working fluid.

Referring now to FIG. 4B, the heat pipe 122' is a closed pulsating heat pipe, which may also be referred to a closed loop pulsating heat pipe (CLPHP). The CLPHP is connected at both ends of the tube to form a closed loop. That is, a formed CLPHP has no ends, but rather is a continuous loop. The heat pipe 122' also has a length l extending a distance between a first end thereof and a second thereof (e.g., while not depicted, similar to the first end 121 and the second end 123 depicted in FIGS. 1 and 2).

As depicted in FIG. 4C, the heat pipe 122" is a closed loop pulsating heat pipe with a check valve 410 integrated therein. The check valve 410 is fluidly coupled to the heat pipe 122" to restrict movement of the working fluid within the heat pipe 122" in a single direction. Various features of the check valve 410 should generally be understood and are not described in further detail herein. The heat pipe 122" also has a length l extending a distance between a first end thereof and a second thereof (e.g., while not depicted, similar to the first end 121 and the second end 123 depicted in FIGS. 1 and 2).

The embodiments of FIGS. 4A-4C generally depict PHPs having a plurality of 180° turns such that a plurality of sections of each PHP are generally parallel to one another between turns. However, this is merely illustrative, and other embodiments are anticipated and included in the scope of the present disclosure. That is, the PHPs depicted in FIG. 4A-4C may include any other arrangement of sections of the PHP, any other degree of turn (e.g., a 360° coiled turn). Further, the number of sections is not limited by the present disclosure. In some embodiments, referring also to FIGS. 1 and 3A-3C, the number of sections may correspond to the number of recesses 136 in the second substrate 134, may be greater than the number of recesses 136 in the second substrate 134 (e.g., such that a plurality of power device stacks 130 may be coupled to the same PHP), or may be less than the number of recesses 136 in the second substrate 134 (e.g., such that a plurality of PHPs are coupled to a single power device stack 130). Illustrative numbers of turns and/or sections of the heat pipes 122, 122', 122" include, but are not limited to, about 2 to about 100, including about 2, about 6, about 10, about 20, about 30, about 40, about 50, about 60, about 70, about 80, about 90, about 100, or any value or range between any two of these values (including endpoints).

Still referring to FIGS. 1, 3A-3C, and 4A-4C, the heat pipes 122, 122', 122" described herein are generally formed of any material, particularly materials that high thermal conductivity (e.g., having a thermal conductivity of 200 W/m K or higher). For example, in some embodiments, the heat pipes 122, 122', 122" may be formed from copper, aluminum, nickel, a copper alloy, an aluminum alloy, a nickel alloy, graphite, carbon fiber, combinations of any of the foregoing, or the like. In some embodiments, the heat pipes 122, 122', 122" may be formed of a material that can be bonded to the recesses 136 in the second substrate 134.

Referring again to FIGS. 4A-4C, the heat pipes 122, 122', 122" described herein may be formed to particular dimensions (e.g., diameter and length) so as to conform to a Bond number (Bo). The Bond number limits the diameter of the capillary tube used to form the heat pipes 122, 122', 122". As the flow inside the tube is mainly driven by the surface tension and opposed by the gravity, the minimum internal diameter of the capillary tube is given by the relation:

$$D \leq D_{cr} = 2[\sigma/g(p_f - p_g)]^{0.5} \quad (1)$$

where D is the allowable diameter of the PHP, $D_{cr}$ is the critical diameter, $\sigma$ is the surface tension, g is the gravity, and $p_f$ and $p_g$ are the densities of the working fluid at liquid and gaseous phases, respectively. If $D \gg D_{cr}$, the effect of surface tension is reduced and the working fluid will stratify by gravity and oscillations will cease. However, if $D \geq D_{cr}$, the flow will circulate, but with the larger plugs of liquid and most of the liquids sticking to the capillary wall of the PHPs. Likewise, if $D \leq D_{cr}$, mostly annular flow with surface tension dominated stable liquid plugs are formed, which assists with the continuous and efficient heat transfer inside the PHP. On the other hand, if $D \ll D_{cr}$, annular flow is not developed, and the flow is limited to bulk movement. Illustrative examples of diameters for the heat pipes 122, 122', 122" include, but are not limited to, from about 1 mm to about 8 mm, including about 1 mm, about 2 mm, about 3 mm, about 4 mm, about 5 mm, about 6 mm, about 7 mm, about 8 mm, or any value or range between any two of these values (including endpoints).

As noted above, the heat pipes 122, 122', 122" may each have a length l corresponding to a length of each section of the heat pipes 122, 122', 122" between turns (inclusive of the turns), as depicted in FIGS. 4A-4C. The length l of the heat pipes 122, 122', 122" may be selected based on the type of working fluid contained therein in some embodiments. Illustrative examples of the lengths l of the heat pipes 122, 122', 122" include, but are not limited to, from about 50 mm to about 500 mm, including about 50 mm, about 100 mm, about 150 mm, about 200 mm, about 250 mm, about 300 mm, about 350 mm, about 400 mm, about 450 mm, about 500 mm, or any value or range between any two of these values (including endpoints). In addition, the length l of the heat pipes 122, 122', 122" may be selected in view of the respective sizes of an evaporator region coupled to an evaporator (e.g., the power device stacks 130 depicted in FIG. 1), an adiabatic region, and a condenser region coupled to the cooling assembly 150 (FIG. 1). In some embodiments, the length of the evaporator region may be equal to the length of the condenser region to achieve optimum heat transfer performance. In some embodiments, the length of the evaporator region may be equal to the length of the condenser region and the adiabatic region.

The cross-sectional shape of the heat pipes 122, 122', 122" is not limited by the present disclosure, and can generally be any cross-sectional shape. In some embodiments, the cross-sectional shape of the heat pipes 122, 122', 122" may be circular or substantially circular, a flat spiral, rectangular, or parallel trapezoidal. Other cross-sectional shapes now known or later developed for facilitating function of the heat pipes 122, 122', 122" are also contemplated and included within the scope of the present disclosure.

As will be described in greater detail herein, the interiors of each of the PHPs depicted in FIGS. 4A-4C holds a working fluid in a plurality phases depending on the location of the working fluid within the PHP. More specifically, the working fluid includes a plurality of liquid slugs 402 and a plurality of vapor plugs 404 (e.g., vapor bubbles) interspersed throughout the PHP. Illustrative examples of the working fluid that is present within the heat pipes 122, 122', 122" include, but are not limited to, water (e.g., deionized water), an alcohol (e.g., ethanol, methanol, propanol, butanol), a ketone (e.g., acetone), a nano-fluid (e.g., colloidal suspensions of nanoparticles and/or metals or metal oxides in base fluids), a refrigerant (e.g., R134a, R600a), a surfactant (e.g., sodium stearate), nitrogen, helium, an ionic liquid, a combination of any of the foregoing, a mixture of any of the foregoing, or the like.

Referring to FIGS. 1, 2, 3A-3C, and 4A-4C, given the foregoing, it should be appreciated that heat pipes 122, 122', 122", once evacuated to a particular pressure and partially filled with a working fluid, results in surface tension that forms the liquid slugs 402 interspersed with the vapor plugs 404. As heat is applied to the evaporator section of the heat pipes 122, 122', 122" (e.g., the portion of the heat pipes 122, 122', 122" coupled to the power device stacks 130), the working fluid begins to evaporate. This results in an increase of vapor pressure inside the heat pipes 122, 122', 122", which causes the vapor plugs 404 in an evaporator zone (e.g., a zone generally corresponding to the location of the power device stacks 130) to grow and push the liquid slugs 402 toward the condenser section of the heat pipes 122, 122', 122" (e.g., the portion of the heat pipes 122, 122', 122" coupled to the cooling assembly 150). As the cooling assembly 150 cools the working fluid, the vapor pressure reduces and the condensation of the working fluid into the vapor plugs 404 occurs. This process between the evaporator (e.g., the power device stacks 130) and the cooling assembly 150 is continuous and results in an oscillating motion within the heat pipes 122, 122', 122". Consequently, heat is transferred through latent heat of the vapor and through sensible heat transported by the liquid slugs 402.

In such a configuration, the tube is first evacuated and then filled partially with a working fluid, which distributes itself naturally in the form of liquid-vapor plugs and slugs inside the capillary tube. One end of this tube bundle receives heat, transferring it to the other end by a pulsating action of the liquid-vapor/bubble-slug system. In some embodiments, there may exist an adiabatic zone in between the two ends thereof. Also, one or more flow-direction control check valves may be introduced at suitable locations to augment the performance.

As previously noted herein, the present disclosure primarily discusses PHPs with respect to heat pipes, particularly PHPs that are used for heat transfer from the power devices embedded in the substrate. However, the present disclosure is not limited to such. Other heat transfer components may also be used without departing from the scope of the present disclosure.

In some embodiments, the heat pipes 122 described herein may be prefabricated heat pipes. As used herein, the term "prefabricated" means that the manufacturing procedure of forming the heat pipes 122 has already been finished before starting with connection of the heat pipes 122 to the various other components described herein. A prefabricated heat pipe may also be referred to as a preformed heat pipe or a readily manufactured heat pipe.

Figure 5A:
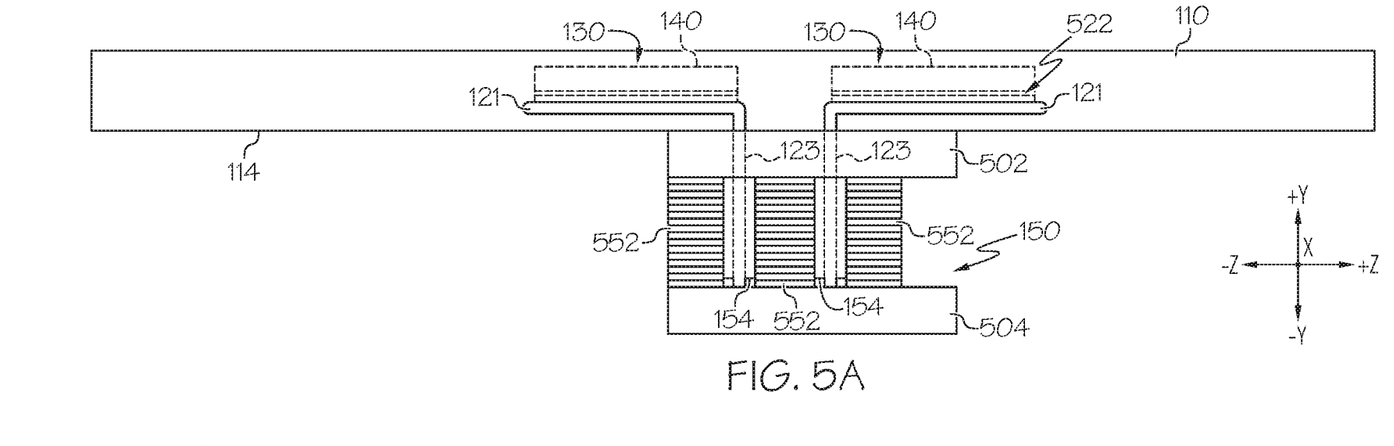
FIG. 5A schematically depicts a front view of an illustrative substrate having an embedded heat pipe coupled to a cooling assembly located at an angle outside the substrate according to one or more embodiments shown and described herein.
Figure 5B:
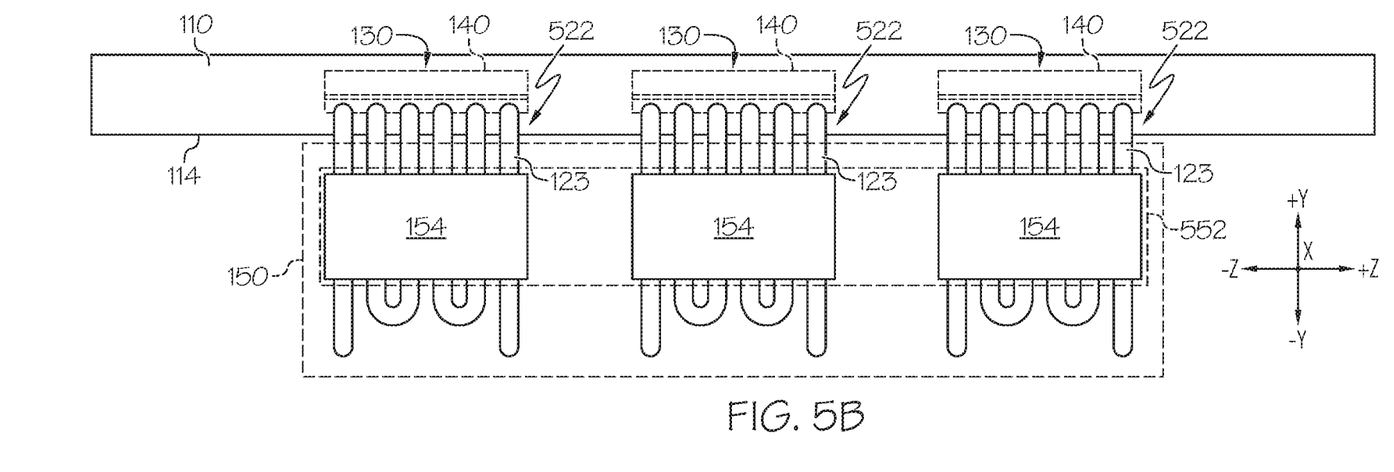
FIG. 5B schematically depicts a side view of the substrate depicted in FIG. 5A with the cooling assembly omitted for illustrative purposes.

The embodiments depicted in FIGS. 1-2 generally depict a single heat pipe 122 (or group of heat pipes 122 if not a PHP) coupled between a single power device stack 130 and a single cooling assembly 150, which are located coplanar with respect to each other. However, other configurations are also contemplated and included within the scope of the present disclosure. For example, as depicted in FIGS. 5A and 5B, the heat pipe 522 may include one or more bends and/or turns to couple to the cooling assembly 150 in a location that is not coplanar with a plurality of power device stacks 130 (e.g., six power device stacks 130 in the embodiments of FIGS. 5A-5B). More specifically, FIGS. 5A and 5B depict a front view and a side view, respectively, of the heat pipe 522 turning (e.g., a 90° turn) and extending out of the substrate 110 and into the cooling assembly 150. That is, each heat pipe 522 includes the first end 121 and the second end 123 arranged transverse to each other. That is, the first end 121 extends in a first direction (e.g., in the +z/−z direction of the coordinate axes of FIG. 5A) and the second end 123 extends in a second direction that is transverse to the first direction (e.g., in the +y/−y direction of the coordinate axes of FIG. 5A). For example, FIGS. 5A-5B depict the second end 123 extending out of the second major surface 114. As previously described herein, the first end 121 is embedded within the substrate 110 and is thermally coupled to the power device stacks 130 as described herein. As each heat pipe 522 transitions from the first end 121 to the second end 123, each heat pipe 522 turns (e.g., rotates to extend in the −y direction of the coordinate axes of FIGS. 5A-5B) and extends out of the substrate 110 and into the cooling assembly 150.

Still referring to FIGS. 5A and 5B, the cooling assembly 150 includes an inlet 502 spaced apart from an outlet 504, the inlet 502 and the outlet 504 generally extending in the plane defined by the x and z axes of the coordinate axes of FIGS. 5A-5B and fluidly coupled to a plurality of substantially parallel cooling plates 552 having an internal fin structure therein such that coolant from the inlet 502 can flow through the plurality of substantially parallel cooling plates 552 and out via the outlet 504. The plurality of substantially parallel cooling plates 552 are further arranged such that the heat spreader layers 154 surrounding the second end 123 of the heat pipe 522 are sandwiched between the plurality of substantially parallel cooling plates 552.

As previously described herein, the number of cooling assemblies 150 is not limited by the present disclosure, and a single cooling assembly 150 may be used to cool any number of heat pipes 522 (which are used to cool any number of power devices 140). For example, as shown in FIGS. 5A-5B, the cooling assembly 150 is thermally coupled to six (6) power device stacks 130 (and accordingly six (6) power devices 140), via a corresponding heat pipe 522 (for a total of six (6) heat pipes 522). As further illustrated in FIGS. 5A-5B, the power device stacks 130 with the power devices 140 thereon are arranged in a 3×2 array. However, this is merely one illustrative embodiment, and other arrangements are contemplated and included within the scope of the present disclosure.

Figure 6:
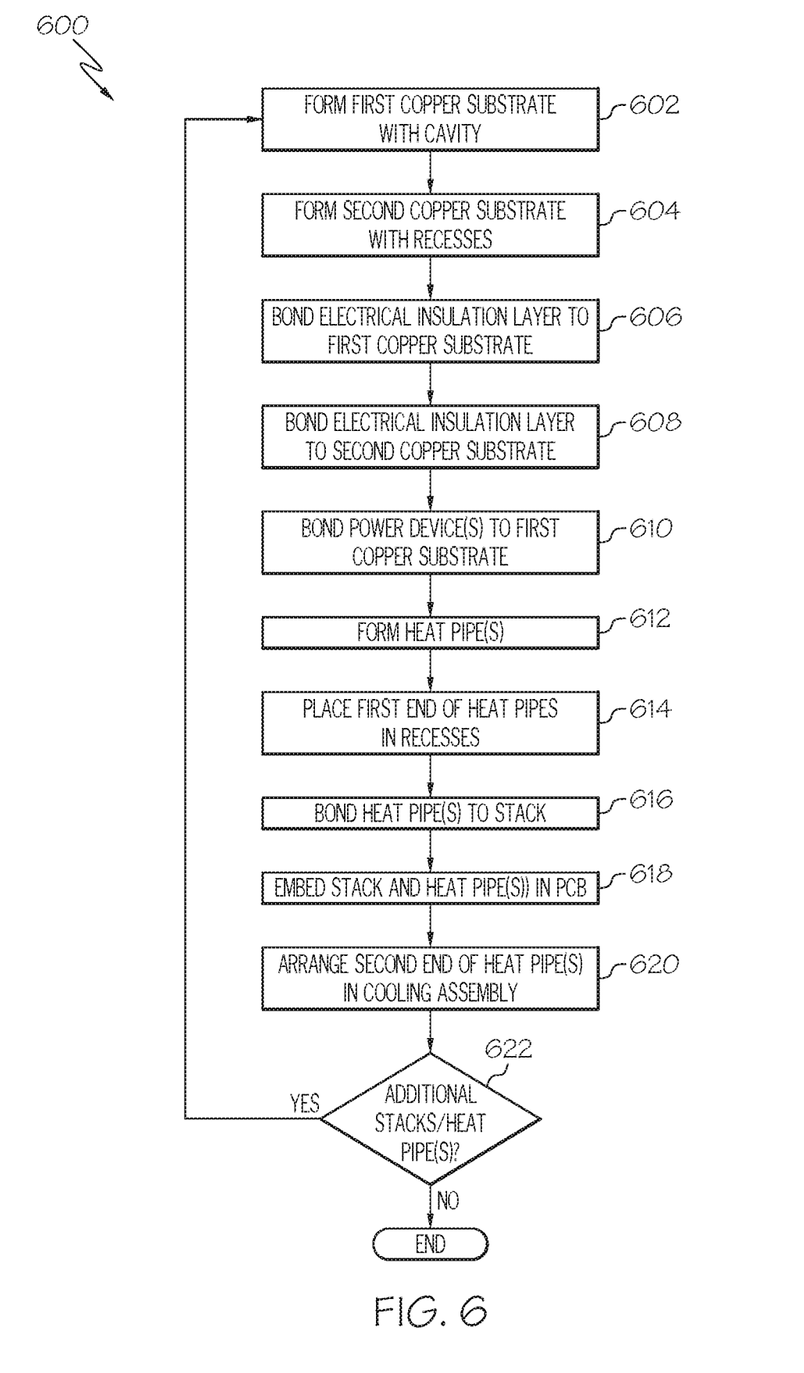
FIG. 6 depicts a flow diagram of an illustrative method of forming an embedded cooling system according to one or more embodiments shown and described herein.
Figure 7:
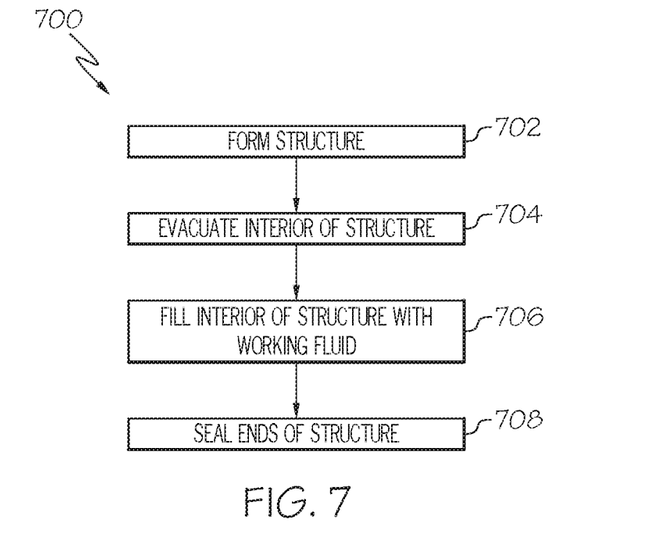
FIG. 7 depicts a flow diagram of an illustrative method of forming a heat pipe that of an embedded cooling system according to one or more embodiments shown and described herein.

The various embedded cooling systems described herein should now be generally understood. Turning to FIGS. 6 and 7, assembly of the embedded cooling systems will now be described. More specifically, FIG. 6 depicts an illustrative method 600 of forming an embedded cooling system as described herein. Further, FIG. 7 depicts an illustrative method 700 of forming an illustrative PHP as described herein. It should be understood that the order of the processes described herein with respect to FIGS. 6 and 7 is merely illustrative, and that the present disclosure is not limited to the order described herein. Illustrative examples of a different ordering of steps will be described herein, but the present disclosure is not limited to such examples.

Referring to FIG. 6, the method 600 includes forming a first substrate (e.g., a first copper substrate) with a cavity therein at block 602. That is, a substrate is formed with a cavity therein, the cavity being shaped and sized to receive one or more power devices therein, as described herein. In some embodiments, the first substrate may be formed by providing a substrate and machining the cavity by removing material therefrom (e.g., machining the cavity). In other embodiments, the first substrate may be formed such that a cavity is present within the substrate (e.g., forming via an additive manufacturing process or the like). In some embodiments, the cavity may not be formed (e.g., embodiments where the power device is placed directly on a surface of the substrate not including a cavity therein).

At block 604, a second substrate (e.g., a second copper substrate) with recesses (e.g., grooves or the like) is formed (e.g., an additional substrate). As previously described herein, the recesses are generally shaped and sized to receive the heat pipes so that the heat pipes are thermally coupled to the other substrate for the purposes of heat transfer. In some embodiments, the second substrate may be formed by providing a substrate and machining the recesses by removing material therefrom (e.g., machining the recesses). In other embodiments, the second substrate may be formed such that the recesses are present within the substrate (e.g., forming via an additive manufacturing process or the like).

An electrical insulation layer is bonded to the first substrate at block 606 and to the second substrate at block 608. That is, an electrical insulation layer is deposited or otherwise bonded on a surface of the first substrate opposite the surface of the first substrate containing the cavity described herein. Further, the electrical insulation layer is deposited or otherwise bonded on a surface of the second substrate opposite the surface of the second substrate containing the recesses described herein. For example, in some embodiments, the electrical insulation layer may be formed on the surfaces of the substrates via silver sintering, TLP bonding, or the like. Other methods of forming the electrical insulation layer on the substrates are also included within the scope of the present disclosure. In some embodiments, the processes according to blocks 606 and 608 may be completed separately as depicted in FIG. 6. In other embodiments, the processes according to blocks 606 and 608 may be completed at substantially the same time (e.g., forming the electrical insulation between the first and second substrates). As a result of completion of the processes according to blocks 606 and 608, the first and second substrates are bonded together with the electrical insulation layer therebetween, with the various surface features of each substrate (e.g., the cavity in the first substrate and the recesses in the second substrate) facing outward and away from each other (e.g., not facing the electrical insulation layer formed between the substrates).

At block 610, one or more power devices are bonded to the first substrate. That is, the one or more power devices are placed within the cavity of the first substrate (if present) and bonded in place using any bonding technique. For example, the one or more power devices may be bonded to the substrate via silver sintering, soldering, or the like.

At block 612, the heat pipes may be formed. The heat pipes may generally be formed via any method of heat pipe formation now known or later developed. For example, in embodiments where the heat pipe is a miniature heat pipe, various methods of forming miniature heat pipes now known or later developed may be used. One illustrative method of forming heat pipes, particularly PHPs, is described with respect to FIG. 7. Accordingly, referring to FIG. 7, the method 700 includes forming the heat pipe structure at block 702. That is, the structure of the PHPs described herein may be formed by any method now known or later developed, particularly methods used for formation of PHPs, including both open loop and closed loop PHPs, as well as closed PHPs with a check valve, as described herein. For example, the process according to block 702 may include constructing an elongated tube of capillary dimensions, bending the tube to form a serpentine configuration whereby a plurality of straight sections are interspersed between a plurality of curved sections, and in embodiments where the PHP is to be a closed loop PHP, bringing the ends together in preparation for joining or preparing the ends for closing after evacuation and filling, as described hereinbelow. At block 704, the interior of the heat pipe structure is evacuated. Any method of evacuation may be used, such as, for example, applying a vacuum to the structure, or the like. Once evacuated, the structure is filled with the working fluid at block 706. As previously described herein, the structure may be filled with water (e.g., deionized water), an alcohol (e.g., ethanol, methanol, propanol, butanol), a ketone (e.g., acetone), a nano-fluid (e.g., colloidal suspensions of nanoparticles and/or metals or metal oxides in base fluids), a refrigerant (e.g., R134a, R600a), a surfactant (e.g., sodium stearate), nitrogen, helium, an ionic liquid, a combination of any of the foregoing, a mixture of any of the foregoing, or the like. At block 708, the ends of the structure may be sealed to maintain the interior filled with the working fluid. For example, in embodiments where the PHP is a closed loop PHP, the ends may be joined together to seal the ends thereof. In embodiments where the PHP is an open loop PHP, the ends may be sealed with a plug or the like.

It should be understood that the process of forming heat pipes according to block 612 may be omitted in some embodiments. For example, in embodiments where the heat pipes are prefabricated heat pipes, preformed heat pipes, or readily manufactured heat pipes, there may not be a need to form the heat pipes, and thus the process according to block 612 may be omitted.

Referring again to FIG. 6, at block 614, a first end (e.g., an evaporator end) of the heat pipe(s) may be placed within the recesses of the second substrate and the heat pipes may be bonded to the stack at block 616. Bonding of the heat pipes to the stack may be completed by any metal-to-metal bonding technique now known or later developed. For example, the heat pipes may be bonded to the stack via soldering, brazing, silver sintering, transient liquid phase (TLP) bonding, or the like. In some embodiments, the processes according to blocks 614 and 616 may be completed at substantially the same time as the process described with respect to block 610. That is, the power devices may be bonded to the first substrate and the heat pipes may be arranged in the recesses and bonded to the second substrate at substantially the same time (e.g., after the heat pipes are formed according to block 612).

At block 618, the one or more heat pipes and the stack coupled thereto may be embedded in the PCB substrate, as described herein. In some embodiments, embedding according to block 618 may include forming the substrate around the one or more heat pipes and the stack and including the various other components described herein. Embedding may further be completed such that a portion of the heat pipes extend out of the PCB substrate, as described herein.

At block 620, a second end (e.g., condenser end) of the heat pipes are arranged within the cooling assembly. That is, the end of the heat pipes opposite the first end (e.g., evaporator end) that extends out of the substrate is coupled to the cooling assembly. For example, one or more heat spreader layers may be arranged to envelop the heat pipes and one or more cold plates may be placed over the heat spreader layers, as described herein.

At block 622, a decision is made as to whether the embedded cooling system includes additional stacks, power devices, and heat pipes (e.g., embodiments containing a plurality of stacks, power devices, and/or heat pipes, as described herein). If additional components are to be added to the embedded cooling system, the process may repeat at block 602. If no further components are to be added, the process may end.

It should now be understood that the embedded cooling systems described herein include power devices (e.g., embedded power semiconductor devices) and heat pipes, such as pulsating heat pipes (PHPs) embedded within substrates such as gate driver printed circuit boards (PCBs). The embedded power devices shown and described herein utilize copper layers and/or insulation layers to form an inverter topology, a convertor topology, or a similar topology. One or more of the copper layers are formed to receive the embedded heat pipes, which are configured to extend from the copper layer(s) to a location outside of the substrate, the location having a cooling assembly that facilitates heat transfer from the power devices out of the PCBs.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. An embedded cooling system, comprising:
a printed circuit board (PCB) substrate
a cooling assembly arranged externally to the PCB substrate;
one or more power device stacks embedded within the PCB substrate each power device stack comprising:
an electrical insulation layer disposed between first and second substrates;
a power device coupled to the first substrate of each power device stack; and
one or more heat pipes having first and second ends, the first end received within a recess of the second substrate and the second end extending outside of the PCB substrate to the cooling assembly, wherein:
the second substrate is coupled to the heat pipes, and the plurality of power device stacks and the cooling assembly are horizontally aligned with respect to each other in a longitudinal direction of the one or more heat pipes, and the plurality of power device stacks are electrically coupled to each other via one or more vias extending in the longitudinal direction.

2. The embedded cooling system of claim 1, wherein the second end of the one or more heat pipes is at least partially disposed within the cooling assembly.

3. The embedded cooling system of claim 1, wherein the cooling assembly comprises:
a heat spreader layer disposed around at least a portion of the second end of the one or more heat pipes; and
a cold plate disposed on the heat spreader layer.

4. The embedded cooling system of claim 1, wherein each one of the one or more heat pipes is an open loop pulsating heat pipe, a closed loop pulsating heat pipe, a closed loop pulsating heat pipe with a check valve, or a miniature heat pipe.

5. The embedded cooling system of claim 1, wherein the first substrate of each of the one or more power device stacks comprises a cavity for receiving the power device.

6. The embedded cooling system of claim 1, wherein the recess is shaped and sized to provide a close mating of the second substrate with the heat pipes.

7. The embedded cooling system of claim 1, wherein the first substrate and the second substrate are formed from copper, aluminum, gold, silver, or an alloy thereof.

8. The embedded cooling system of claim 1, wherein the electrical insulation layer is a ceramic dielectric layer or an insulated metal substrate (IMS) dielectric layer.

9. The embedded cooling system of claim 1, wherein one or more active or passive components are coupled to a first major surface of the PCB substrate.

10. The embedded cooling system of claim 1, wherein the PCB substrate comprises one or more power conductive layers electrically coupled to the power device via the one or more vias.

11. The embedded cooling system of claim 1, wherein the one or more heat pipes comprise a horizontal bend.

12. The embedded cooling system of claim 1, wherein the one or more power device stacks comprises a plurality of power device stacks arranged in an array, wherein two of the plurality of power device stacks are coupled to each one of the one or more heat pipes.

13. The embedded cooling system of claim 1, wherein a power module comprising the PCB substrate and the power device has a power rating greater than or equal to 40 kilowatts (kW).

14. The embedded cooling system of claim 1, wherein the one or more heat pipes horizontally extend across an entire length of the heat pipes from the first end to the second end.

15. An embedded cooling system, comprising:
a printed circuit board (PCB) substrate having a first major surface opposite a second major surface;
a plurality of power device stacks embedded within the PCB substrate between the first major surface and the second major surface, each one of the plurality of power device stacks comprising:
a first substrate having a cavity formed therein,
a second substrate having one or more recesses formed therein, and
an electrical insulation layer disposed between the first substrate and the second substrate such that the cavity and the one or more recesses face away from each other;
a plurality of power devices, each one of the plurality of power devices received within the cavity of the first substrate of each of the plurality of power device stacks respectively and thermally coupled to the first substrate;
one or more heat pipes having a first end and a second end spaced a distance apart from the first end, the first end embedded within the PCB substrate and the second end extending outside of the PCB substrate, the one or more heat pipes received within the one or more recesses of the second substrate; and
at least one cooling assembly arranged externally to the PCB substrate such that the second end of the one or more heat pipes is at least partially disposed within the at least one cooling assembly,
wherein the plurality of power device stacks and the at least one cooling assembly are horizontally aligned with respect to each other in a longitudinal direction of the one or more heat pipes, and the plurality of power device stacks are electrically coupled to each other via one or more vias extending in the longitudinal direction.

16. The embedded cooling system of claim 15, wherein each one of the one or more heat pipes is an open loop pulsating heat pipe, a closed loop pulsating heat pipe, a closed loop pulsating heat pipe with a check valve, or a miniature heat pipe.

17. The embedded cooling system of claim 15, wherein the PCB substrate comprises one or more power conductive layers electrically coupled to the plurality of power devices via the one or more vias.

18. The embedded cooling system of claim 15, wherein a power module comprising the PCB substrate and the plurality of power devices has a power rating greater than or equal 40 kilowatts (kW).

19. A method of forming an embedded cooling system, the method comprising:
forming each of a plurality of power device stacks by:
forming a first substrate with a cavity therein;
forming a second substrate having a plurality of recesses therein;
bonding the first substrate and the second substrate to an electrical insulation disposed between the first substrate and the second substrate such that the cavity of the first substrate faces in a direction opposite of a direction in which the plurality of recesses face;
bonding a power device within the cavity of the first substrate; and
bonding one or more pulsating heat pipes within the plurality of recesses of the second substrate; and
embedding the plurality of power device stacks and the one or more pulsating heat pipes within a substrate such that a portion of the one or more pulsating heat pipes extends to a location that is external to the substrate to a cooling assembly arranged externally to the substrate,
wherein the plurality of power device stacks and the cooling assembly are horizontally aligned with respect to each other in a longitudinal direction of the one or more heat pipes, and the plurality of power device stacks are electrically coupled to each other via one or more vias extending in the longitudinal direction.

20. The method of claim 19, further comprising:
arranging the portion of the one or more pulsating heat pipes that extend to the location external to the substrate within the cooling assembly.

* * * * *

UNITED STATES PATENT AND TRADEMARK OFFICE
CERTIFICATE OF CORRECTION

PATENT NO. : 11,849,539 B2  
APPLICATION NO. : 16/992561  
DATED : December 19, 2023  
INVENTOR(S) : Feng Zhou and Ercan Mehmet Dede Page 1 of 1

It is certified that error appears in the above-identified patent and that said Letters Patent is hereby corrected as shown below:

On the Title Page

Item (56), U.S. Patents Documents Column 2, cite no. 1, delete "Asfia" and insert --Asfia et al.--, therefor.

In the Drawings

In drawing sheet(s) 6 of 7, figure 6, delete "PIPE(S))" of, " 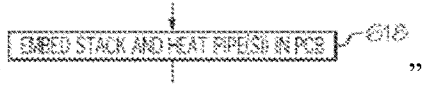 " and insert --PIPE(S)--, therefor.

Signed and Sealed this  
Twenty-sixth Day of March, 2024

Katherine Kelly Vidal  
*Director of the United States Patent and Trademark Office*